United States Patent
Mizuno

(10) Patent No.: US 8,054,611 B2
(45) Date of Patent: Nov. 8, 2011

(54) POROUS METAL THIN FILM, METHOD FOR MANUFACTURING THE SAME, AND CAPACITOR

(75) Inventor: Masao Mizuno, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 536 days.

(21) Appl. No.: 12/330,066

(22) Filed: Dec. 8, 2008

(65) Prior Publication Data

US 2009/0174987 A1    Jul. 9, 2009

(30) Foreign Application Priority Data

Jan. 8, 2008    (JP) .................... 2008-001454

(51) Int. Cl.
H01G 9/14      (2006.01)
H01G 9/15      (2006.01)
H01G 9/004     (2006.01)
H01G 9/045     (2006.01)
B32B 3/10      (2006.01)

(52) U.S. Cl. ........ 361/529; 361/528; 361/523; 361/532; 428/304.4; 428/607; 428/323; 428/328; 29/25.03

(58) Field of Classification Search .......... 361/523, 361/528, 529, 532; 428/304.4, 607, 323, 428/328; 29/25.03
See application file for complete search history.

(56) References Cited

U.S. PATENT DOCUMENTS

| | | | | |
|---|---|---|---|---|
| 3,293,507 A | * | 12/1966 | Smith .......................... 361/518 |
| 3,427,132 A | * | 2/1969 | Goon ............................ 423/409 |
| 3,466,508 A | * | 9/1969 | Booe .............................. 361/536 |
| 3,723,838 A | * | 3/1973 | Kumagai ....................... 361/322 |
| 3,828,227 A | * | 8/1974 | Millard et al. ................. 361/540 |
| 3,970,903 A | * | 7/1976 | Shirn ............................. 361/533 |
| 4,090,288 A | * | 5/1978 | Thompson et al. .......... 29/25.03 |
| 4,203,194 A | * | 5/1980 | McGrath ...................... 29/25.03 |
| 4,423,004 A | * | 12/1983 | Ross ............................. 29/25.03 |
| 4,544,403 A | * | 10/1985 | Schiele et al. ................ 420/427 |
| 4,571,664 A | * | 2/1986 | Hyland ......................... 361/540 |
| 4,660,127 A | * | 4/1987 | Gunter .......................... 361/540 |
| 4,791,532 A | * | 12/1988 | Gouvernelle et al. ........ 361/529 |
| 5,410,445 A | * | 4/1995 | Kanetake ..................... 361/539 |

(Continued)

FOREIGN PATENT DOCUMENTS

JP          63-255910        10/1988

(Continued)

OTHER PUBLICATIONS

U.S. Appl. No. 12/325,673, filed Dec. 1, 2008, Mizuno.

*Primary Examiner* — Anatoly Vortman

(74) *Attorney, Agent, or Firm* — Oblon, Spivak, McClelland, Maier & Neustadt, L.L.P.

(57) ABSTRACT

A porous metal thin film formed from aluminum has a film structure in which domains having an average diameter of 200 nm or more, and 500 nm or less and being formed through aggregation of a plurality of grains having an average grain diameter of 50 nm or more, and 160 nm or less are distributed discretely at an average distance of 5 nm or more, and 40 nm or less, wherein the area occupied by the above-described domains is 60% or more, and 90% or less in a cross-section in any direction of the porous metal thin film.

12 Claims, 4 Drawing Sheets

U.S. PATENT DOCUMENTS

| | | | |
|---|---|---|---|
| 6,238,444 B1 * | 5/2001 | Cadwallader | 29/25.03 |
| 6,319,292 B1 * | 11/2001 | Pozdeev-Freeman et al. | 29/25.03 |
| 6,432,161 B1 * | 8/2002 | Oda et al. | 75/363 |
| 6,679,934 B2 * | 1/2004 | Rao et al. | 75/245 |
| 6,786,951 B2 * | 9/2004 | He et al. | 75/365 |
| 6,960,237 B2 * | 11/2005 | Naito | 75/255 |
| 6,970,345 B2 * | 11/2005 | Oh et al. | 361/540 |
| 7,066,975 B2 * | 6/2006 | Oda et al. | 75/244 |
| 7,443,653 B2 * | 10/2008 | Kim et al. | 361/523 |
| 7,473,294 B2 * | 1/2009 | Oda et al. | 75/244 |
| 7,570,480 B2 * | 8/2009 | Kim et al. | 361/540 |
| 7,666,247 B2 * | 2/2010 | He et al. | 75/252 |
| 7,674,401 B2 * | 3/2010 | Maruyama | 252/500 |
| 7,727,508 B2 * | 6/2010 | Shi et al. | 423/594.17 |
| 2002/0088507 A1 * | 7/2002 | Rao et al. | 148/422 |
| 2002/0104404 A1 * | 8/2002 | Naito | 75/245 |
| 2003/0218858 A1 * | 11/2003 | Kim et al. | 361/523 |
| 2004/0066607 A1 * | 4/2004 | Edson et al. | 361/528 |
| 2005/0088805 A1 * | 4/2005 | Edson et al. | 361/529 |
| 2006/0260109 A1 * | 11/2006 | Vaisman et al. | 29/25.41 |
| 2006/0262489 A1 * | 11/2006 | Vaisman et al. | 361/540 |
| 2006/0275204 A1 * | 12/2006 | Tagusagawa et al. | 423/594.17 |
| 2007/0068341 A1 * | 3/2007 | Cheng et al. | 75/255 |
| 2007/0279841 A1 * | 12/2007 | Kim et al. | 361/540 |
| 2008/0019081 A1 * | 1/2008 | Kim et al. | 361/535 |
| 2008/0062617 A1 * | 3/2008 | Edson et al. | 361/529 |
| 2008/0080124 A1 * | 4/2008 | Kim et al. | 361/529 |
| 2009/0154065 A1 * | 6/2009 | Choi et al. | 361/523 |
| 2009/0154066 A1 * | 6/2009 | Choi et al. | 361/523 |
| 2009/0154068 A1 * | 6/2009 | Choi et al. | 361/533 |
| 2010/0326239 A1 * | 12/2010 | Shi et al. | 75/369 |

FOREIGN PATENT DOCUMENTS

| | | |
|---|---|---|
| JP | 01215959 A * | 8/1989 |
| JP | 10-270291 | 10/1998 |
| JP | 2000-299255 | 10/2000 |
| JP | 2006-108159 | 4/2006 |

* cited by examiner

POROUS METAL THIN FILM, METHOD FOR MANUFACTURING THE SAME, AND CAPACITOR

BACKGROUND OF THE INVENTION

1. Field of the Invention

The present invention relates to a porous metal thin film having a large surface area, a method for manufacturing the same, and a capacitor.

2. Description of the Related Art

In recent years, surfaces of thin films have been roughened in order to improve the functions of the thin films. For example, for the purpose of improving the capacitance of an electrolytic capacitor, a surface of aluminum foil serving as an electrode material is roughened by a chemical conversion treatment so as to increase a surface area.

In a catalyst field as well, platinum black and gold black produced by roughening surfaces of platinum and gold have been used as electrodes and catalysts for various chemical reactions. Furthermore, for example, carbon, ceramic, and metals have been used while surface areas thereof have been increased by surface roughening through conversion to a porous surface for the purpose of improving the functions of automobile exhaust gas treatment catalysts, fuel cell electrode catalysts, $TiO_2$ catalyst electrodes for dye-sensitized solar cells, lithium ion secondary batteries, and the like. Moreover, in the area of field emission displays, electrons are generated by application of a voltage to fine protrusions on an electrode surface, wherein fine protrusions which appear in surface roughening are used.

The surface roughening of a metal film through conversion to a porous surface to increase a surface area, as described above, has been used in wide fields industrially, and further roughening of surfaces has been required. For example, if the surface area of an aluminum surface used for an electrolytic capacitor can be further increased through surface roughening, the performance can be improved.

Therefore, as for a method for facilitating surface roughening, it has been proposed to subjecting aluminum foil for an electrolytic capacitor to surface roughening by using an etching method and an evaporation method in combination to increase the surface area of an electrolytic film and improve the capacitor characteristics. For example, Japanese Unexamined Patent Application Publication No. 63-255910 discloses a method in which a surface of aluminum foil is chemically etched and, thereafter, titanium thin films are deposited sequentially by an evaporation method, so as to facilitate surface roughening. Japanese Unexamined Patent Application Publication No. 2000-299255 discloses a method in which a surface of aluminum foil is roughened through chemical etching and, thereafter, Ti or other metal is deposited. Japanese Unexamined Patent Application Publication No. 10-270291 discloses a method in which a thin Ni film hardly oxidized naturally is evaporated on an aluminum foil surface subjected to an etching treatment, so as to improve the characteristics of a capacitor without impairing an effect of surface roughening of the aluminum foil. Japanese Unexamined Patent Application Publication No. 2006-108159 discloses an electrolytic capacitor including electrode foil in which aggregates of fine grains composed of aluminum provided with an aluminum oxide layer on a surface are adhered to aluminum foil. Japanese Unexamined Patent Application Publication No. 11-317331 discloses a heat-reactive evaporation method in which an evaporation gas is introduced in an atmosphere of inert gas, e.g., nitrogen, containing oxygen while a base material is in the state of being heated.

Incidentally, in contrast to the chemical etching method, the physical evaporation method does not use chemical agents and, therefore, has an advantage that, for example, chemical treatment facilities are not required. Consequently, the physical evaporation method is industrially useful if roughening of a metal thin film surface can be realized by the physical evaporation method alone and, in addition, with a simple process not including heat-formation of film.

SUMMARY OF THE INVENTION

However, in order to respond to demands for an increase in surface area which have been still intensified in recent years, further roughening of a surface is required. If a metal film surface is roughened and the surface area can be increased to, for example, ten times or more larger than that in related art, the surface roughening is effective at improving the capacitance of a capacitor and improving surface reactivity of a catalyst and the like.

Accordingly, it is an object of the present invention to provide a porous metal thin film having a large surface area and being effective at improving the capacitance of a capacitor or enhancing performance of a catalyst electrode, a method for manufacturing the same, and a capacitor.

The present inventors conducted intensive research on heat-formation of a film, thick film formation, high-pressure film formation, and the like as a method for forming an aluminum thin film with a surface roughened to increase a surface area by a physical evaporation method.

The heat-formation of a film will be discussed. In the case where an aluminum film is heat-formed, surface asperities are formed and the surface becomes cloudy. The factor of occurrence of the surface asperities attributes to a difference in thermal expansion coefficient between a substrate and an aluminum thin film formed. In the film formation, since the aluminum film and the substrate expand thermally because of heat during evaporation and sputtering, a thermal stress is applied to the aluminum film surface. It is believed that the aluminum film surface is deformed because of this stress, many protrusions having diameters of about 100 nm are formed on the film and, thereby, the film is roughened and becomes cloudy. However, in this method, many flat portions remain on the film surface and, therefore, the surface area cannot increase dramatically.

Furthermore, in the case where an aluminum film is formed by the physical evaporation method so as to become a thick film having a film thickness of 1 μm or more, surface asperities appear on the surface even in room temperature film formation. This is because the film grows in a preferential azimuth of growth during deposition of aluminum. The diameters of substrate surface asperities formed by this method are 500 nm or more. However, the aluminum surface asperities formed by this method primarily composed of crystal grains having diameters of 500 nm or more and the crystal grains are bonded densely. Therefore, there is no gap between crystal grains, and the structures of asperities are simple. Consequently, the surface area cannot increase significantly.

Moreover, regarding the evaporation method and the magnetron sputtering method, it is known that a surface is allowed to have asperities by increasing a film formation gas pressure. This phenomenon is a general phenomenon observed with respect to not only the aluminum film, but also any metal thin film or oxide. This is because in the case where a film is formed under a condition of a high pressure, during film formation, sputtered atoms or vaporized atoms collide with each other in a chamber before reaching a substrate, a part of them aggregate by themselves and, thereafter, reach the substrate. In the film formation by the magnetron sputtering method, usually, an inert gas Ar is used as a film formation gas, a smooth film is formed at an Ar gas pressure of about 0.5 mTorr to 3 mTorr, and as the gas pressure increases, asperities are formed by degrees. When the gas pressure is 5 mTorr or more, asperities are formed on the surface. The resulting metal film is a surface-roughened film having a columnar structure, but is a dense film having no gap between metal crystal grains. Furthermore, the diameters of crystal grains are 500 nm or more and, therefore, a surface-roughened film having a sufficient surface area cannot be formed.

Then, the present inventors conducted intensive research. As a result, it was found that in physical evaporation methods, e.g., an evaporation method and a sputtering method, a porous metal thin film having a porous film surface structure, in which domains formed through aggregation of a plurality of grains were included, a gap was present between a domain and another domain and, in addition, an area occupied by the domains relative to the total area of the film surface was within a specific range, was able to be formed at a room temperature film formation condition by mixing 1% to 30% of hydrogen gas into Ar serving as a film formation gas.

That is, the present invention has been made on the basis of the above-described findings. In order to solve the above-described problems, a porous metal thin film according to a first aspect of the present invention is formed from aluminum and has a film structure in which domains having an average diameter of 200 nm or more, and 500 nm or less and being formed through aggregation of a plurality of grains having an average grain diameter of 50 nm or more, and 160 nm or less are distributed discretely at an average distance of 5 nm or more, and 40 nm or less, wherein the area occupied by the domains is 60% or more, and 90% or less in a cross-section in any direction of the porous metal thin film.

This porous metal thin film has the film structure in which domains having an average diameter of 200 nm or more, and 500 nm or less and being formed through aggregation of a plurality of grains having an average grain diameter of 50 nm or more, and 160 nm or less are distributed discretely at an average distance of 5 nm or more, and 40 nm or less, wherein the area occupied by the above-described domains is 60% or more, and 90% or less in a cross-section in any direction of the porous metal thin film. Therefore, the porous metal thin film has a large surface area and is effective at improving the capacitance of a capacitor or improving the surface activity of a catalyst and the like.

According to a second aspect of the present invention, in the above-described porous metal thin film, the above-described grain is a secondary grain formed through aggregation of a plurality of fine subgrains having an average grain diameter of 10 nm or more, and 25 nm or less.

In the case where the grain is a secondary grain formed through aggregation of a plurality of fine subgrains having an average grain diameter of 10 nm or more, and 25 nm or less, the surface area of this porous metal thin film can increase significantly.

According to a third aspect of the present invention, the above-described porous metal thin film has a film thickness of 50 nm or more, and 100 μm or less.

In the case where this porous metal thin film has a film thickness of 50 nm or more, and 100 μm or less, a thin film having a large surface area can be realized while the electrical conductivity is maintained.

According to a fourth aspect of the present invention, the above-described porous metal thin film has an electric resistivity of 2.7 μΩcm or more, and 100 μΩcm or less.

In the case where the electric resistivity of 2.7 μΩcm or more, and 100 μΩcm or less, this porous metal thin film can be used as an electrode material for a capacitor.

According to a fifth aspect of the present invention, a capacitor including an electrode material provided with the above-described porous metal thin film on a surface is provided.

This capacitor includes an electrode material provided with the above-described porous metal thin film on a surface. Therefore, a large capacitance can be obtained because the electrode has a large surface area.

According to a sixth aspect of the present invention, a method for manufacturing a porous metal thin film formed from aluminum is provided, the method including the step of forming a film composed of an evaporation material containing aluminum on a substrate formed from anodized aluminum or aluminum by a physical evaporation method by using a film formation gas containing 1% to 30% of hydrogen and an evaporation source formed from the above-described evaporation material.

In this method, a porous metal thin film having the above-described porous structure formed from the evaporation material containing aluminum can be formed on the substrate formed from anodized aluminum or aluminum by the physical evaporation method by using the film formation gas containing 1% to 30% of hydrogen and the evaporation source formed from the above-described evaporation material.

According to a seventh aspect of the present invention, in the above-described method for manufacturing a porous metal thin film, the above-described film formation gas is a rare gas substantially not containing oxygen nor nitrogen.

In this method, the rare gas substantially not containing oxygen nor nitrogen is used as the film formation gas. Therefore, a porous metal thin film having the above-described film surface structure can be obtained.

According to an eighth aspect of the present invention, in the above-described method for manufacturing a porous metal thin film, the film formation is conducted by a sputtering method at a film formation gas pressure of 3 to 100 mTorr and a power feed of 2 to 20 W/cm$^2$.

In this method, the film formation is conducted by a sputtering method at a film formation gas pressure of 3 to 100 mTorr and a power feed of 2 to 20 W/cm$^2$. Consequently, a porous metal thin film having a large surface area based on the above-described porous structure and being effective at improving the capacitance of a capacitor or improving the surface activity of a catalyst and the like can be formed.

According to a ninth aspect of the present invention, in the above-described method for manufacturing a porous metal thin film, a substrate formed from anodized aluminum is used as the above-described substrate and a film formation gas containing 10% to 30% of hydrogen is used.

In this method, it is preferable that a substrate formed from anodized aluminum is used as the substrate and a film formation gas containing 10% to 30% of hydrogen is used.

The porous metal thin film according to an aspect of the present invention has the specific film surface structure in which domains having an average diameter of 200 nm or more, and 500 nm or less and being formed through aggregation of a plurality of grains having an average grain diameter of 50 nm or more, and 160 nm or less are included, a gap of 5 nm or more, and 40 nm or less is present between a domain and another domain and, in addition, an area occupied by the domains relative to the total area of the film surface is 60% or more, and 90% or less. Therefore, the porous metal thin film has a large surface area and is effective at improving the capacitance of a capacitor or enhancing the performance of a catalyst electrode.

The method according to an aspect of the present invention can produce a porous metal thin film, in which the surface is roughened and the surface area is increased by a factor of 10 to 2,000 because of the above-described specific film surface structure, under a specific condition without conducting a heating treatment nor a process control.

DESCRIPTION OF THE PREFERRED EMBODIMENTS

Figure 1:
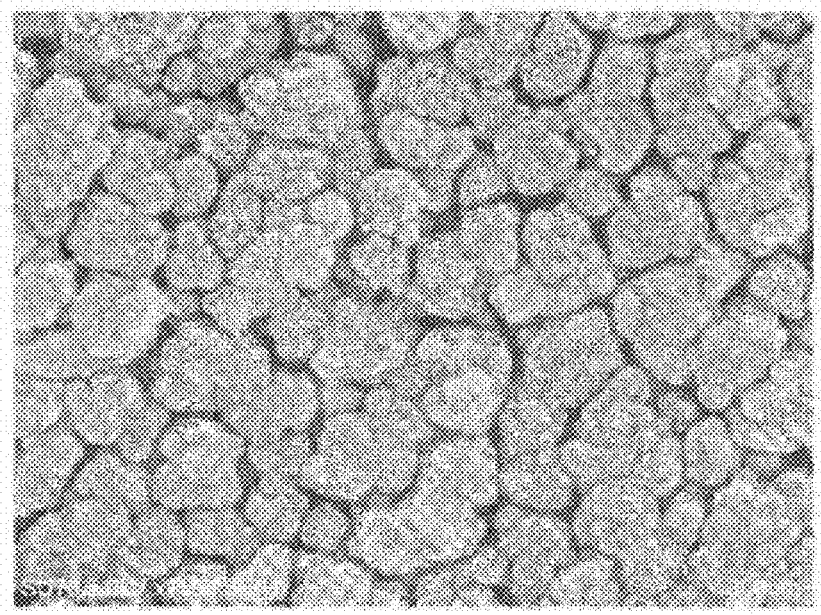
FIG. 1 is a scanning electron micrograph of a surface of a porous aluminum thin film produced in Example 1.

A porous metal thin film according to an aspect of the present invention (hereafter referred to as a "thin film of the present invention"), a method for manufacturing the same, and an electrolytic capacitor will be described below in detail.

The thin film of the present invention has a porous structure formed from aluminum.

This porous structure is a structure in which domains formed through aggregation of a plurality of grains are distributed. This domain is formed through aggregation of a plurality of grains so as to take the shape of a sphere, the shape of a deformed sphere, or furthermore, an indefinite shape.

The average diameter of this domain is 200 nm or more, and 500 nm or less, and a gap of 5 nm or more, and 40 nm or less is present between a domain and another domain. In the present invention, the average diameter of the domains is an average value of major diameters measured in at least two axis directions passing through the center.

The domains are distributed discretely at an average distance of 5 nm or more, and 40 nm or less. That is, a gap of 5 nm or more, and 40 nm or less is present between a crystal grain and another crystal grain constituting the porous structure. In the present invention, the distance between domains refers to a distance between the nearest outer surfaces of adjacent domains. In the case where a gap between a domain and another domain is less than 5 nm and the thin film of the present invention is used as an electrode of an electrolytic capacitor, an electrolytic solution does not infiltrate into spaces and, therefore, the effect of increasing the capacitance due to an increase in surface area cannot be exerted. In the case where a gap between a domain and another domain exceeds 40 nm, the film structure becomes weak. A preferable range is 10 nm or more, and 30 nm or less.

In the thin film of the present invention, the area occupied by the domains is 60% or more, and 90% or less in a cross-section in any direction of the thin film. Here, the cross-section in any direction of the thin film refers to a cross-section obtained by cutting the thin film of the present invention in any direction. The area occupied by the domains refers to the total area of domains observed in the cross-section relative to the total area of the cross-section. In the case where the average diameter of the domains exceeds 500 nm, or in the case where the area of the domains exceeds 90%, the effect of increasing the surface area is low. In the case where the average diameter of the domains is less than 200 nm, no grain structure appears in the domain, and the effect of increasing the surface area cannot be exerted. In the case where the area of the domains is less than 60%, the film structure becomes weak and the film does not function as a self-sustained film. Preferably, the average diameter of the domains is 250 nm or more, and 450 nm or less. Furthermore, a preferable range of the area of the domains is 65% or more, and 85% or less.

The gap between a domain and another domain is 5 nm or more, and 40 nm or less.

A grain constituting the domain is not limited to the shape of a perfect sphere, but is a grain having a nearly spherical outside shape including from a perfectly spherical shape to even a deformed outside shape which is distorted in at least one direction. The average grain diameter of the grains is 50 nm or more, and 160 nm or less. Grains having an average grain diameter of less than 50 nm are not formed. Regarding grains having an average grain diameter exceeding 160 nm, one grain constitutes one domain and, therefore, the effect of increasing the surface area is not exerted. Preferable average grain diameter of grains is 60 nm or more, and 150 nm or less. Here, the average grain diameter of grains is an average value of major diameters measured in at least two axis directions passing through the center.

This grain may be a secondary grain formed through aggregation of a plurality of fine subgrains. This secondary grain is not limited to a grain in the shape of a perfect sphere, but may be a grain having a nearly spherical outside shape including from a perfectly spherical shape to even a deformed outside shape which is distorted in at least one direction. It is preferable that the grain is in the form of a secondary grain which is formed through aggregation of a plurality of fine subgrains having an average grain diameter of 10 nm or more, and 25 nm or less from the viewpoint of an increase in surface area. In the case where the diameter of the domain is 250 nm or more and the average grain diameter of grains is 30 nm or more, an aggregation of a plurality of fine subgrains having an average grain diameter of 10 to 25 nm is formed in the grain. In the case where the average grain diameter of subgrains exceeds 25 nm, a subgrain structure disappears. Furthermore, if the average grain diameter of subgrains is less than 10 nm, the subgrain structure is not observed. Here, the average grain diameter of subgrains is an average value of major diameters measured in at least two axis directions passing through the center.

It is preferable that the film thickness of the thin film of the present invention is 50 nm or more, and 10,000 nm or less. If the film thickness is less than 50 nm, an effect of conversion to a porous surface is low. If the film thickness exceeds 10,000 nm, the film is bended because of an internal stress and, therefore, film formation is difficult. Incidentally, in order to specify the capacitance ratio to be 100 times or more, it is necessary that the film thickness is 200 nm or more. If the film thickness exceeds 10,000 nm, an effect of increasing the capacitance ratio becomes low. More preferably, the film thickness is 300 nm or more, and 800 nm or less.

It is preferable that the electric resistivity of the thin film of the present invention is 2.7 μΩcm or more, and 100 μΩcm or less because sufficient electrical conductivity as an electrode can be exhibited. The lower limit of the electric resistivity of the thin film of the present invention is specified to be 2.7 μΩcm which is the electric resistivity of aluminum because the thin film is formed from aluminum. Since the thin film of the present invention has a porous structure, spaces are included in the film. Therefore, conduction paths are reduced, and apparently, the electric resistivity increases by about 5 to 6 μΩcm. If the film thickness is reduced, conduction paths are reduced locally. Therefore, the electric resistivity further increases to about 10 μΩcm. Moreover, when the film thickness is 50 nm, the electric resistivity increases to about 100 μΩcm. However, in the case where the electric resistivity exceeds 100 μΩcm, application to antistatic use is possible.

As necessary, a protective film composed of $SiO_2$, $TiO_2$, $MgF_2$, or the like can be formed on the thin film of the present invention.

The thin film of the present invention has the above-described porous structure. Therefore, fine asperities are formed on the surface, the surface has a dark appearance, and the reflectance of visible light to near infrared rays (wavelength: 250 nm to 2,000 nm) is 10% to 30%. Consequently, the thin film of the present invention can also be used as a low-reflection electrode. Here, the reason the visible light to near infrared ray reflectance is low is believed that light is irregularly reflected in the fine structure and the light is absorbed by the film surface. This light absorption occurs in visible (wavelength: 400 nm to 800 nm) and near infrared regions (800 to 2,000 nm). On the other hand, in the far infrared regions (wavelength: 2,000 nm or more), the reflectance increases. Therefore, the thin film of the present invention can be used as a visible absorption film or a near infrared absorption film, and is useful as a good heat-absorbing film with low infrared radiation. When the thin film is irradiated actually with a halogen lamp, the light is absorbed and the temperature is raised efficiently, and a good function as a heat-absorbing film is performed, as is shown in the results of halogen lamp irradiation test (FIG. 7) conducted in Example 5 described below.

The thin film of the present invention can be produced by a method including the step of forming a film composed of an evaporation material containing aluminum on a substrate formed from anodized aluminum or aluminum by a physical evaporation method by using a film formation gas containing 1% to 30% of hydrogen and an evaporation source formed from the above-described evaporation material. This manufacturing method may include, for example, a step of cleaning a surface of a substrate, a step of preheating the substrate with the cleaned surface in the inside of a film formation apparatus, a step of after-treating the substrate provided with the thin film of the present invention, and a step of forming a protective film composed of $SiO_2$, $TiO_2$, $MgF_2$, or the like besides the step of forming a film by the physical evaporation method.

As for the substrate on which the thin film of the present invention is formed, a substrate formed from anodized aluminum or aluminum can be used. The anodized aluminum substrate is preferable because the above-described porous thin film having a porous structure in which domains formed through aggregation of grains composed of an aggregate of subgrains are distributed or a porous structure in which domains formed through aggregation of grains not composed of an aggregate of subgrains are distributed can be formed efficiently. In the anodized aluminum substrate, the surface is interspersed with anodized alumina having grain diameters of about 50 to 100 nm, and along with this, fine asperities are formed. Therefore, a porous thin film having the above-described porous structure easily grows while these asperities serve as starting points. Consequently, a porous thin film having good film quality can be formed with a high degree of efficiency as compared with that in the case where a smooth glass substrate is used. An alumina film resulting from a natural oxidation film is formed on a surface of the aluminum substrate as well, and cracks and asperities are present in this natural oxidation film. Therefore, regarding the aluminum substrate, a porous thin film having the above-described porous structure can be formed while these cracks and asperities serve as starting points. However, film formation is difficult as compared with that of the anodized aluminum substrate. On the other hand, regarding a glass substrate, although it is possible to form the porous thin film having the above-described porous structure, in many cases films cannot be formed satisfactorily if certain criteria are not met. Therefore, in the case where the glass substrate is used, the yield decreases by about 1/30 as compared with that in the case where the above-described anodized aluminum substrate is used.

As for the film formation gas, a rare gas substantially not containing oxygen nor nitrogen is used. In the present invention, the phrase "substantially not containing oxygen nor nitrogen" refers to that the oxygen content is 1 ppm or less and the nitrogen content is 10 ppm or less. As for the rare gas, Ar, He, Ne, and the like can be used.

The hydrogen content in this film formation gas is 1% to 30%. In this manner, the aluminum thin film having the above-described porous structure can be formed. In the case where the hydrogen content is less than 1%, an effect is exerted at a low level. In the case where the content exceeds 30%, the effect is saturated and the film formation rate decreases, so that the practicability is low. Preferably, the hydrogen content is 10% or more, and 30% or less. It is desirable to use at 5% or less from the viewpoint of under the explosion limit of hydrogen.

Examples of physical evaporation methods include a vacuum evaporation method and a sputtering method. Most of all, in the case where a film is formed by the sputtering method, it is preferable that the film formation gas pressure is specified to be 3 to 100 mTorr and the power feed is specified to be 2 to 20 W/cm². In the case where a film is formed by a vacuum evaporation method, 10 mTorr to 10 Torr is preferable.

As for the evaporation source used for the physical evaporation, a target, an evaporation source, an evaporation target, or a tablet, which is formed from an evaporation material containing aluminum constituting the thin film of the present invention, is used. In the case where a film is formed by a vacuum evaporation method or a sputtering method, an evaporation source, an evaporation target, or a tablet can be selected appropriately in the vacuum evaporation method, and a target can be selected appropriately in the sputtering method in accordance with the composition of a thin film to be formed. For example, in the case where a thin film composed of aluminum is formed, an evaporation source formed from pure aluminum can be used. The thin film of the present invention formed on a substrate is formed having the same composition as that of this evaporation source.

As for the sputtering method, methods of magnetron sputtering, ion beam sputtering, and the like can be adopted. In particular, magnetron sputtering is preferable because a large area, uniform diffuse reflection film is formed easily.

In the present invention, the reason the diffuse reflection film having the above-described porous structure is obtained is believed to be as described below.

Usually, a hydrogen molecule has low reactivity with aluminum, and aluminum hydride is not formed stably. However, in the case where film formation is conducted in a hydrogen-containing Ar atmosphere serving as a film formation gas in the sputtering method or the evaporation method, hydrogen is atomized or ionized in a chamber so that the reactivity is enhanced, hydrogen is forcedly temporarily dissolved into the inside of aluminum, and an aluminum film is formed on a substrate on an "as-is" basis. Just after the film formation, hydrogen in the inside of the aluminum thin film becomes unstable, and is released from the film. In this process, many fine pores are formed in the film surface and voids are formed. It is believed that these voids expand along with the growth of the film and a porous body having complicated asperities grows after a while.

The thin film formed by the above-described method, in which a gas component not reactive with a metal is forcedly absorbed and released thereafter, has the same composition as that of the target material or the evaporation source. Therefore, when the target material is pure aluminum, the film becomes pure aluminum. Since the rare gas substantially not containing oxygen nor nitrogen gas is used as the film formation gas, aluminum oxide, aluminum nitride, and the like are not formed. Consequently, the electric resistivity of the porous aluminum thin film produced according to an aspect of the present invention does not increase, a loss due to electrical resistance is small in the case where the porous aluminum film is used as an electrode, and superiority in energy efficiency is held.

A film formation method in the atmosphere containing hydrogen, as described above, is a convenient method without the need for conducting heat film formation and, in addition, the film formation rate of 10 nm/s or more can be realized with respect to a power feed of 10 W/cm$^2$. There is an advantage that a roughened surface can be formed easily without touching on the process, e.g., changing of the film formation condition with time, during film formation.

In the case where the thin film of the present invention is formed on a surface of an electrode material of an electrolytic capacitor, an electrolytic capacitor having a high capacitance can be formed. This electrolytic capacitor has a structure in which, for example, separation paper is sandwiched between an anode aluminum foil (electrode material) and a cathode aluminum foil (electrode material), each provided with a lead wire, they are wound into the shape of a circular cylinder, the separation paper is impregnated with an electrolytic solution, and they are enclosed in a package. The thin films of the present invention are formed on opposed surfaces of the both electrode materials, the anode aluminum foil (electrode material) and the cathode aluminum foil (electrode material) and, thereby, the surfaces of those electrode materials are roughened, so that the surface area can increase. In this manner, an electrolytic capacitor having a significantly large capacitance can be formed.

EXAMPLES

The present invention will be more specifically described below with reference to examples and comparative examples. The present invention is not limited to the following examples.

Example 1

A porous aluminum thin film was formed by using a substrate composed of 1000 aluminum having a thickness of 1 mm and a diameter of 5.08 cm (2 inches) and by using a magnetron sputtering apparatus. A pure aluminum target having a purity of 4N was used as a sputtering target, an ultimate degree of vacuum was specified to be $1.2 \times 10^{-6}$ Torr, and a 20% $H_2$-80% Ar mixed gas was used as a film formation gas. DC discharge was conducted under the condition of a film formation gas pressure of 10 mTorr, a power feed of 10 W/cm$^2$, and a distance between the substrate and the target of 60 mm. After film formation was conducted for 100 seconds, the film thickness was measured with a probe thickness gauge. The film thickness was 1,100 nm.

The surface of the resulting porous aluminum thin film was observed with a scanning electron microscope (SEM). FIG. 1 shows a photograph taken at 150,000-fold magnification. As shown in this photograph (FIG. 1), there are domains separated with black portions on the surface of the porous aluminum thin film. The domain was formed through aggregation of a plurality of spherical grains. It was made clear by further detailed observation that the spherical grain was in the form of a secondary grain formed from finer spherical grains (sub-grains). This photograph was subjected to image analysis, so that the average diameter of domains, the average grain diameter of spherical grains, and the average grain diameter of fine spherical subgrains were measured. As a result, the average grain diameter of fine spherical subgrains was 6.7 μm, the average grain diameter of spherical grains formed through aggregation of fine spherical subgrains was 33 nm, and the average diameter of domains formed through aggregation of spherical grains was 115 nm. Furthermore, a black portion was present between a domain and another domain, and domains were distributed while a distance between a domain and another domain was maintained at 2 nm or more, and 20 nm or less in average. Furthermore, the proportion of the area occupied by domains relative to the total area of the cross-section was calculated resulting in 68%.

Subsequently, two substrates provided with this porous aluminum thin film were prepared. The porous aluminum thin films were opposed to each other and allowed to sandwich cellophane paper having a thickness of 0.25 mm and being impregnated with pure water having an electrical conductivity of 1 μS/cm therebetween, so as to prepare a plate capacitor. The capacitance of the resulting plate capacitor was measured resulting in 980 μF.

For purposes of comparison, as in the above description, a dense film having a film thickness of 300 nm was formed by using a substrate composed of 1000 aluminum where the film formation gas was specified to be Ar and the gas pressure was specified to be 2 mTorr. Two substrates provided with this aluminum film were prepared. The aluminum films were opposed to each other and a plate capacitor as in the above description was prepared. The capacitance was measured resulting in 1.0 μF.

Consequently, in Example 1, it was made clear that a capacitor having a capacitance 100 times larger than the capacitance of the capacitor formed from the dense aluminum film not having the porous structure was able to be formed from the porous aluminum thin film having the increased surface area.

Example 2

A 1000 aluminum plate having a thickness of 1 mm and a diameter of 5.08 cm (2 inches) was subjected to an electrolysis treatment in 15% sulfuric acid solution at a DC current density of 150 A/m$^2$ at a voltage of 15 V for 20 minutes, so that an anodized aluminum substrate including an anodized alumina film having a film thickness of 10 μm on a surface was prepared.

A porous aluminum thin film having a film thickness of 2,000 nm was formed as in Example 1 except that the resulting anodized aluminum substrate was used as the substrate, a 3% $H_2$-97% Ar mixed gas was used as the film formation gas, and the power feed was specified to be 4 W/cm$^2$.

Figure 2:
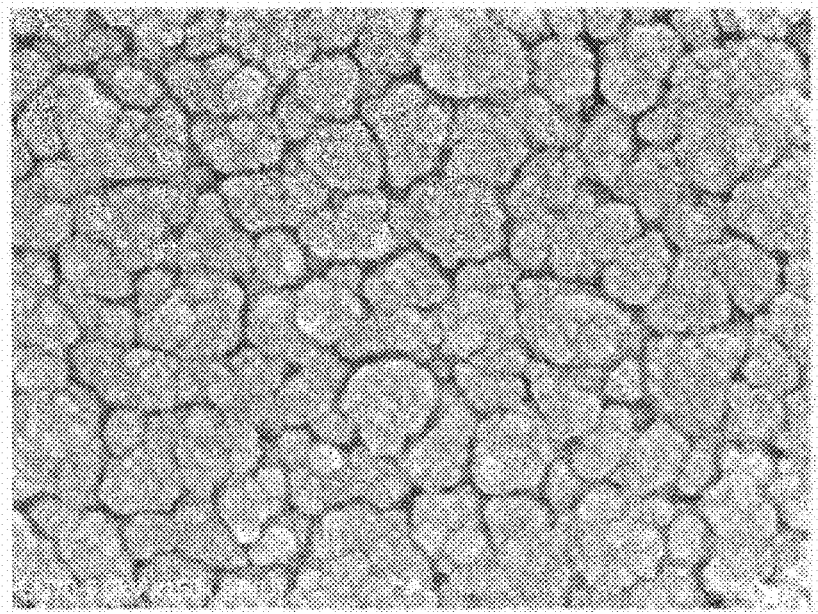
FIG. 2 is a scanning electron micrograph of a surface of a porous aluminum thin film produced in Example 2.

The surface of the resulting porous aluminum thin film was observed with a scanning electron microscope (SEM). FIG. 2 shows a photograph taken at 150,000-fold magnification. As shown in this photograph (FIG. 2), there are domains separated with black portions on a surface of a porous aluminum thin film. The domain was formed through aggregation of a plurality of spherical grains. It was made clear by further detailed observation that the grain was in the form of a secondary grain formed from finer spherical grains (subgrains). This photograph was subjected to image analysis, so that the average diameter of domains, the average grain diameter of spherical grains, and the average grain diameter of fine spherical subgrains were measured. As a result, the average grain diameter of fine spherical subgrains was 7 μm, the average grain diameter of spherical grains formed through aggregation of fine spherical subgrains was 27 nm, and the average diameter of domains formed through aggregation of spherical grains was 73 nm. Furthermore, a black portion was present between a domain and another domain, and domains were distributed while a distance between a domain and another domain was maintained at 2 nm or more, and 20 nm or less in average. The proportion of the area occupied by domains relative to the total area of the cross-section was calculated resulting in 82%.

Subsequently, a plate capacitor was prepared as in Example 1, and the capacitance was measured resulting in 140 μF.

Consequently, in Example 2, it was made clear that a capacitor having a capacitance 140 times larger than the capacitance of the capacitor which was formed in Example 1 for purposes of comparison and which was formed from the dense aluminum film not having the porous structure was able to be formed from the porous aluminum thin film having the increased surface area.

Example 3

A porous aluminum thin film having a film thickness of 5,000 nm was formed on a substrate surface as in Example 1 except that a 10% $H_2$-90% Ar mixed gas was used as the film formation gas, and the power feed was specified to be 4 W/cm$^2$.

Figure 3:
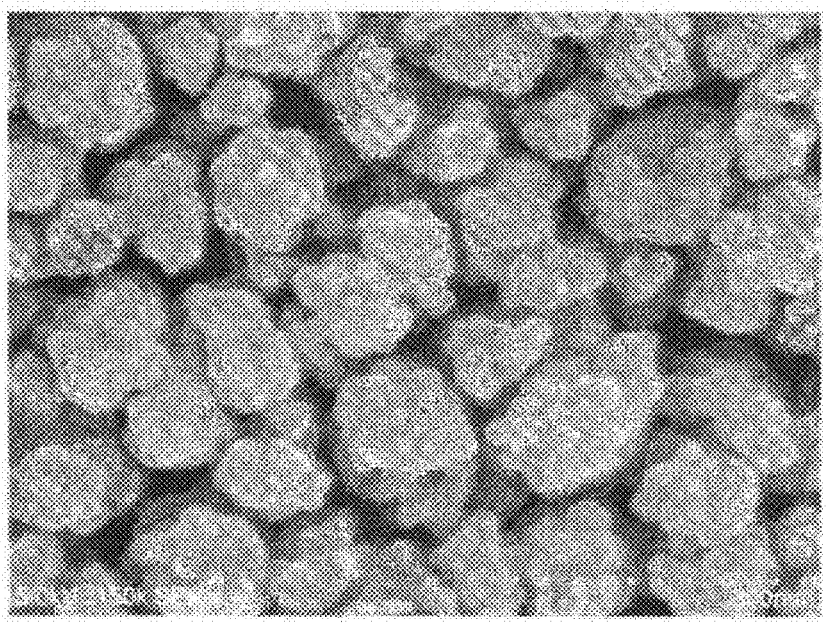
FIG. 3 is a scanning electron micrograph of a surface of a porous aluminum thin film produced in Example 3.

The surface of the resulting porous aluminum thin film was observed with a scanning electron microscope (SEM). FIG. 3 shows a photograph taken at 150,000-fold magnification. As shown in this photograph (FIG. 3), there are domains separated with black portions on a surface of a porous aluminum thin film. The domain was formed through aggregation of a plurality of spherical grains. Furthermore, finer spherical grain was not observed. This photograph was subjected to image analysis, so that the average diameter of domains and the average grain diameter of spherical grains were measured. As a result, the average grain diameter of spherical grains was 23 nm and the average diameter of domains formed through aggregation of spherical grains was 120 nm. Furthermore, a black portion was present between a domain and another domain, and domains were distributed while a distance between a domain and another domain was maintained at 10 nm or more, and 40 nm or less in average. The proportion of the area occupied by domains relative to the total area of the cross-section was calculated resulting in 61%.

Subsequently, a plate capacitor was prepared as in Example 1, and the capacitance was measured resulting in 1,450 μF.

Consequently, in Example 3, it was made clear that a capacitor having a capacitance about 1,500 times larger than the capacitance of the capacitor which was formed in Example 1 for purposes of comparison and which was formed from the dense aluminum film not having the porous structure was able to be formed from the porous aluminum thin film having the increased surface area.

Comparative Example 1

An aluminum film having a film thickness of 2,000 nm was formed as in Example 1 except that an Ar gas was used as the film formation gas.

Figure 4:
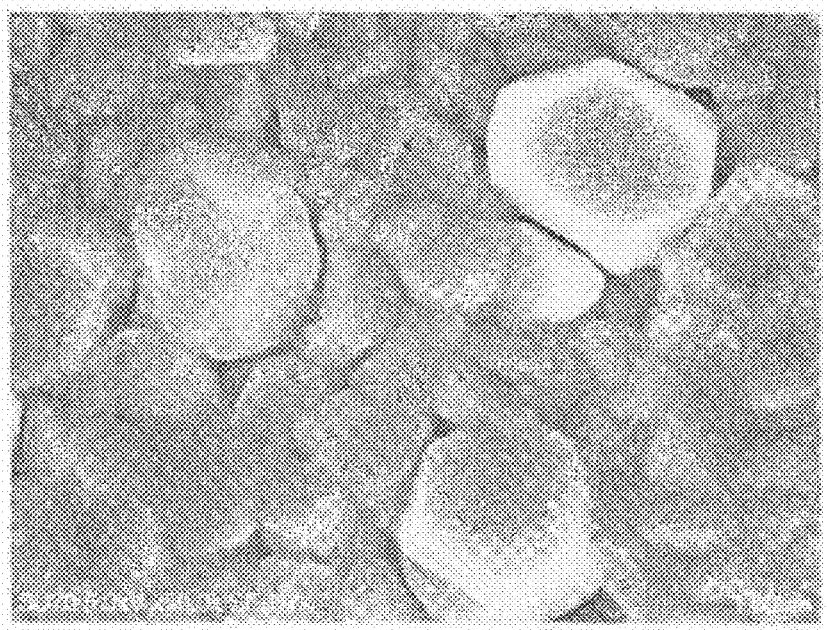
FIG. 4 is a scanning electron micrograph of a surface of a porous aluminum thin film produced in Comparative example 1.

The surface of the resulting aluminum film was observed with a scanning electron microscope (SEM). FIG. 4 shows a photograph taken at 60,000-fold magnification. As shown in this photograph (FIG. 4), dense aluminum crystal grains grew on the surface of the aluminum film, many crystal grains having diameters exceeding 600 nm were present. There was no gap between a crystal grain and another crystal grain. Fine grain structure was not formed.

Subsequently, two substrates provided with this aluminum film on a surface were prepared. A plate capacitor was formed as in Example 1, and the capacitance was measured. The capacitance was 1.3 μF and, therefore, a limited effect of increasing the capacitance was exerted as compared with that of the capacitor which was formed in Example 1 for purposes of comparison and which was formed from the dense aluminum film not having the porous structure.

Comparative Example 2

A porous aluminum thin film having a film thickness of 100 nm was formed on a substrate surface as in Example 1 except that a 1% $H_2$-99% Ar mixed gas was used as the film formation gas and the power feed was specified to be 5 W/cm$^2$. There were asperities on a surface of the resulting porous aluminum thin film.

Figure 5:
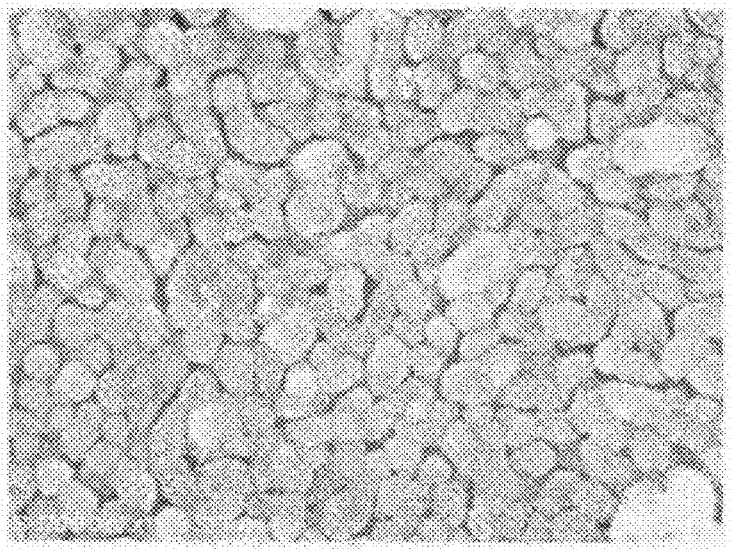
FIG. 5 is a scanning electron micrograph of a surface of a porous aluminum thin film produced in Comparative example 2.

The surface of the resulting porous aluminum thin film was observed with a scanning electron microscope (SEM). FIG. 5 shows a photograph taken at 150,000-fold magnification. As shown in this photograph (FIG. 5), aluminum crystal grains having grain diameters of 60 nm grew on the surface of the porous aluminum thin film, but fine grain structure was not observed in the inside. Although black gaps between crystal grains were observed, the proportion of the area occupied by crystal grain regions other than gap portions relative to the total area of the film surface was 92%.

Subsequently, two substrates provided with this porous aluminum thin film, which had asperities, on a surface were prepared. A plate capacitor was formed as in Example 1, and the capacitance was measured. The capacitance was 12 μF and, therefore, an effect of increasing the capacitance was 12 times relative to the capacitance of the capacitor which was formed in Example 1 for purposes of comparison and which was formed from the dense aluminum film not having the porous structure.

Example 4

Porous aluminum thin films having film thicknesses of 10 nm, 50 nm, 210 nm, 700 nm, 2,000 nm, 5,000 nm, and 9,500 nm were formed as in Example 1 except that a 15% H$_2$-85% Ar mixed gas was used as the film formation gas, the film formation gas pressure was specified to be 8 mTorr, and the power feed was specified to be 7 W/cm$^2$.

Regarding each of these porous aluminum thin films, two substrates provided with the porous aluminum thin film on a surface were prepared. A plate capacitor was formed as in Example 1, and the capacitance was measured. It was determined on a film thickness of the porous aluminum thin film formed on the surface basis that the capacitance was how many times larger than the capacitance of the capacitor which was formed in Example 1 for purposes of comparison and which was formed from the dense aluminum film not having the porous structure. The results thereof are shown in FIG. 6.

Figure 6:
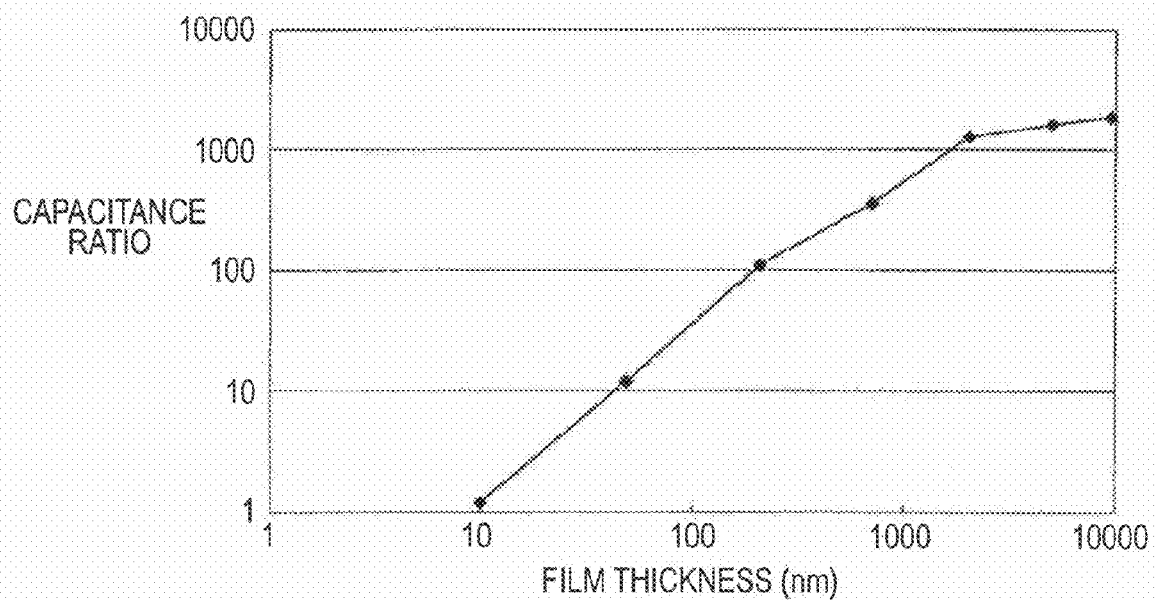
FIG. 6 is a graph showing an effect of increasing a capacitance depending on the film thickness in a porous aluminum thin film produced in Example 4.

As shown in FIG. 6, the capacitance increased by 12 times at a film thickness of 50 nm, and by 110 times at 210 nm. Furthermore, the capacitance increased by 1,300 times at a film thickness of 2,000 nm, and by 1,800 times at 9,500 nm.

Example 5

Each of porous aluminum thin films having film thicknesses of 100 nm, 500 nm, and 2,000 nm was formed on an aluminum substrate as in Example 4.

A thin film test piece having a dimension of 30 mm long× 30 mm wide was cut from each of the substrates provided with the above-described porous aluminum thin films and the substrate which was formed in Example 1 for purposes of comparison and which was provided with the dense aluminum film not having the porous structure.

Halogen Lamp Irradiation Test

The thin film of each of the thin film test pieces was irradiated with a halogen lamp of 150 W at a distance of 25 cm, and the rise in temperature was measured. The measurement results are shown in FIG. 7.

Figure 7:
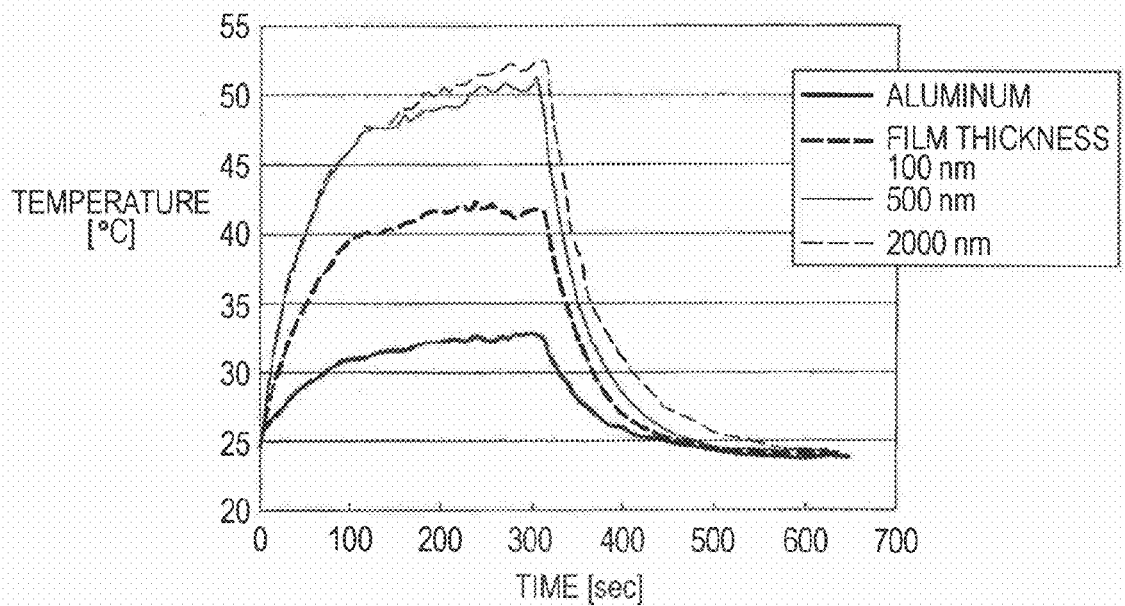
FIG. 7 is a graph showing the results of halogen lamp irradiation experiment in Example 5.

According to the results shown in FIG. 7, regarding the dense aluminum film not having the porous structure, the temperature which was initially 25° C. was raised to 33° C. in 5 minutes because of halogen lamp irradiation. On the other hand, regarding the porous aluminum thin film, the temperature which was initially 25° C. was raised to 52° C. in 5 minutes. As is clear from this result, the thin film of the present invention (porous aluminum thin films having film thicknesses of 100 nm, 500 nm, and 2,000 nm) absorbs light and the temperature is raised efficiently.

Measurement of Reflectance of Specular Reflection

Regarding the thin film test pieces including porous aluminum thin films having thicknesses of 500 nm and 2,000 nm and the anodized aluminum substrate prepared in Example 2, the reflectance of specular reflection of light reflected by a film surface of the porous aluminum thin film or a substrate surface, where an incident angle was 5 degrees and a reflection angle was 5 degrees, was measured by using a spectroreflectometer. The measurement results of the reflectance are shown in FIG. 8.

Figure 8:
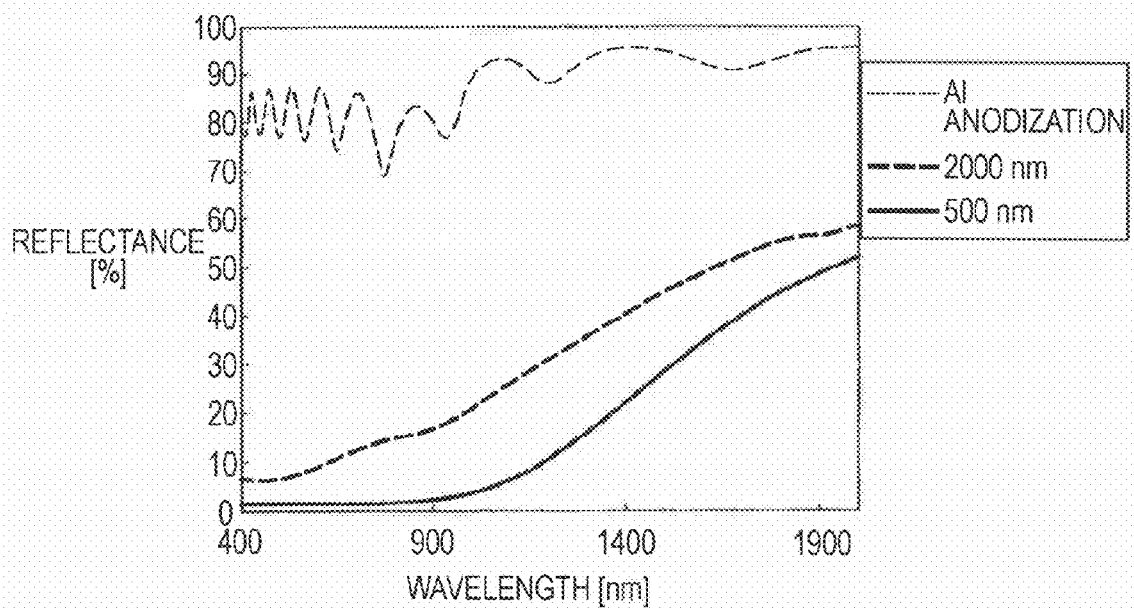
FIG. 8 is a graph showing the measurement results of the reflectance of specular reflection in Example 5.

As shown in FIG. 8, regarding the anodized aluminum substrate, the specular reflection of the light in a wavelength region of 400 nm to 2,000 nm shows a high reflectance exceeding 60%. On the other hand, the thin films of the present invention (porous aluminum thin films having film thicknesses of 500 nm and 2,000 nm) exhibit a reflectance of 1% to 15% in the visible region (wavelength: 400 nm to 800 nm), and a reflectance of 60% or less in the near infrared region (800 to 2,000 nm). As is clear from these results, the thin film of the present invention reflects light in the visible to near infrared region at high efficiency.

What is claimed is:

1. A porous metal thin film comprising aluminum, the film having a film structure in which domains having an average diameter of 200 nm or more, and 500 nm or less and being formed through aggregation of a plurality of grains having an average grain diameter of 50 nm or more, and 160 nm or less are distributed discretely at an average distance of 5 nm or more, and 40 nm or less, wherein the area occupied by the domains is 60% or more, and 90% or less in a cross-section in any direction of the porous metal thin film.

2. The porous metal thin film according to claim 1, wherein the grain is a secondary grain formed through aggregation of a plurality of fine subgrains having an average grain diameter of 10 nm or more, and 25 nm or less.

3. The porous metal thin film according to claim 1, wherein the film thickness is 50 nm or more, and 10,000 nm or less.

4. The porous metal thin film according to claim 1, wherein the electric resistivity of the film is 2.7 μΩcm or more, and 100 μΩcm or less.

5. A capacitor comprising an electrode material provided with the porous metal thin film according to claim 1 on a surface.

6. A capacitor comprising an electrode material provided with the porous metal thin film according to claim 2 on a surface.

7. A capacitor comprising an electrode material provided with the porous metal thin film according to claim 3 on a surface.

8. A capacitor comprising an electrode material provided with the porous metal thin film according to claim 4 on a surface.

9. A method for manufacturing a porous metal thin film formed from aluminum according to claim 1, the method comprising the step of forming a film composed of an evaporation material containing aluminum on a substrate formed from anodized aluminum or aluminum by a physical evaporation method by using a film formation gas containing 1% to 30% of hydrogen and an evaporation source formed from the evaporation material.

10. The method for manufacturing a porous metal thin film according to claim 9, wherein the film formation gas is a rare gas substantially not containing oxygen nor nitrogen.

11. The method for manufacturing a porous metal thin film according to claim 9, wherein the film formation is conducted by a sputtering method at a film formation gas pressure of 3 to 100 mTorr and a power feed of 2 to 20 W/cm$^2$.

12. The method for manufacturing a porous metal thin film according to claim 9, wherein a substrate formed from anodized aluminum is used as the substrate and a film formation gas containing 10% to 30% of hydrogen is used.

* * * * *